United States Patent
Hsieh et al.

(10) Patent No.: US 8,933,343 B2
(45) Date of Patent: Jan. 13, 2015

(54) ELECTRONIC STRUCTURE AND ELECTRONIC PACKAGE COMPONENT FOR INCREASING THE BONDING STRENGTH BETWEEN INSIDE AND OUTSIDE ELECTRODES

(71) Applicant: Inpaq Technology Co., Ltd., Miaoli County (TW)

(72) Inventors: Ming-Fung Hsieh, Changhua County (TW); Yu-Chia Chang, Taichung (TW); Chun-Pin Huang, Hsinchu (TW); Yung-Chang Peng, Miaoli County (TW)

(73) Assignee: Inpaq Technology Co., Ltd., Miaoli County (TW)

( * ) Notice: Subject to any disclaimer, the term of this patent is extended or adjusted under 35 U.S.C. 154(b) by 134 days.

(21) Appl. No.: 13/783,643

(22) Filed: Mar. 4, 2013

(65) Prior Publication Data

US 2014/0247575 A1    Sep. 4, 2014

(51) Int. Cl.
| | |
|---|---|
| H05K 1/16 | (2006.01) |
| H05K 1/03 | (2006.01) |
| H05K 1/09 | (2006.01) |
| H05K 1/11 | (2006.01) |
| H05K 7/00 | (2006.01) |
| H01L 29/40 | (2006.01) |
| H05K 1/18 | (2006.01) |

(52) U.S. Cl.
CPC ..................................... *H05K 1/184* (2013.01)
USPC ........... 174/260; 174/255; 174/257; 174/261; 361/782; 257/773; 257/775; 257/776

(58) Field of Classification Search
CPC .... H01L 23/52; H01L 23/528; H01L 23/5283
USPC ............... 174/255, 257, 260, 261; 361/304.1, 361/311, 782; 257/773, 775, 776
See application file for complete search history.

(56) References Cited

U.S. PATENT DOCUMENTS

| | | | |
|---|---|---|---|
| 2003/0222335 A1* | 12/2003 | Hirano et al. .................. | 257/678 |
| 2008/0047137 A1* | 2/2008 | Asahi et al. ..................... | 29/876 |
| 2010/0276190 A1* | 11/2010 | Matsushita et al. ........... | 174/261 |
| 2011/0024175 A1* | 2/2011 | Satou ............................. | 174/260 |

* cited by examiner

*Primary Examiner* — Timothy Thompson
*Assistant Examiner* — Sherman Ng
(74) *Attorney, Agent, or Firm* — Li & Cai Intellectual Property (USA) Office (57) ABSTRACT

An electronic structure includes a substrate body, an electronic package structure and a conductive unit. The electronic package structure is disposed on the substrate body. The electronic package structure includes a first inner electrode portion, a second inner electrode portion, a first outer electrode portion electrically connected to the first inner electrode portion, and a second outer electrode portion electrically connected to the second inner electrode portion. The conductive unit includes a first conductive body and a second conductive body respectively electrically contacting the first and the second outer electrode portions. The electronic package structure has a first notch and a second notch, the first outer electrode portion is extended into the first notch to contact the top surface of the first inner electrode portion, and the second outer electrode portion is extended into the second notch to contact the top surface of the second inner electrode portion.

10 Claims, 5 Drawing Sheets

ELECTRONIC STRUCTURE AND ELECTRONIC PACKAGE COMPONENT FOR INCREASING THE BONDING STRENGTH BETWEEN INSIDE AND OUTSIDE ELECTRODES

BACKGROUND OF THE INVENTION

1. Field of the Invention

The instant disclosure relates to an electronic structure and an electronic package component, and more particularly to an electronic structure and an electronic package component for increasing the bonding strength between inside and outside electrodes.

2. Description of Related Art

With the rapid development of semiconductor package technology, passive elements are in increasing demands. Passive elements do not affect the basic characteristics of signal, but only allow the signals to pass therethrough. Passive elements include capacitors, resistors and inductors. Compared to active elements, the passive elements have their resistances unchanged even when voltages or currents change, because the passive elements do not participate in electron exercises. Any product that is driven by electricity needs passive elements that provide electrical loop controlling functions. Such applications include 3C and other industrial fields. In general, the passive elements are disposed on the substrate and electrically connected to the substrate through solder bumps by reflow soldering. However, it is easy for the inside electrode of the passive element to break away or separated from the outside electrode of the passive element by the residual stress generated by the reflow soldering process.

SUMMARY OF THE INVENTION

One aspect of the instant disclosure relates to an electronic structure and an electronic package component for increasing the bonding strength between inside and outside electrodes.

One of the embodiments of the instant disclosure provides an electronic structure for increasing the bonding strength between inside and outside electrodes, comprising: a substrate unit, an electronic unit and a conductive unit. The substrate unit includes a substrate body. The electronic unit includes at least one electronic package component disposed on the substrate body, wherein the electronic package component includes a first inner electrode portion, a second inner electrode portion corresponding to the first inner electrode portion, a first outer electrode portion electrically contacting the first inner electrode portion, and a second outer electrode portion corresponding to the first outer electrode portion and electrically contacting the second inner electrode portion, and the electronic package component has two opposite lateral end portions respectively covered by the first outer electrode portion and the second outer electrode portion. The conductive unit includes a first conductive body disposed on the substrate body and electrically contacting the first outer electrode portion and a second conductive body disposed on the substrate body and electrically contacting the second outer electrode portion. More precisely, at least one electronic package component has a first notch and a second notch corresponding to the first notch, the first inner electrode portion has a first top connection surface formed on a top side thereof and connected to the first notch, the second inner electrode portion has a second top connection surface formed on a top side thereof and connected to the second notch, the first outer electrode portion is extended into the first notch to contact the first top connection surface of the first inner electrode portion, and the second outer electrode portion is extended into the second notch to contact the second top connection surface of the second inner electrode portion.

Another one of the embodiments of the instant disclosure provides an electronic structure for increasing the bonding strength between inside and outside electrodes, comprising: a substrate unit, an electronic unit and a conductive unit. The substrate unit includes a substrate body. The electronic unit includes at least one electronic package component disposed on the substrate body, wherein the electronic package component includes a first inner electrode portion, a second inner electrode portion corresponding to the first inner electrode portion, a first outer electrode portion electrically contacting the first inner electrode portion, and a second outer electrode portion corresponding to the first outer electrode portion and electrically contacting the second inner electrode portion, and the electronic package component has two opposite lateral end portions respectively covered by the first outer electrode portion and the second outer electrode portion. The conductive unit includes a first conductive body disposed on the substrate body and electrically contacting the first outer electrode portion and a second conductive body disposed on the substrate body and electrically contacting the second outer electrode portion. More precisely, the electronic package component has a first notch and a second notch corresponding to the first notch, the first inner electrode portion has a first gap concaved from a top side thereof and connected to the first notch, the second inner electrode portion has a second gap concaved from a top side thereof and connected to the second notch, the first outer electrode portion is extended into the first notch and the first gap to contact the first top connection surface of the first inner electrode portion, and the second outer electrode portion is extended into the second notch and the second gap to contact the second top connection surface of the second inner electrode portion.

Yet another one of the embodiments of the instant disclosure provides an electronic package component for increasing the bonding strength between inside and outside electrodes, comprising: a package body, at least one electronic chip, a first inner electrode portion, a second inner electrode portion, a first outer electrode portion and a second outer electrode portion. The package body has a first lateral end portion and a second lateral end portion opposite to the first lateral end portion. The electronic chip is disposed inside the package body. The first inner electrode portion is disposed inside the package body. The second inner electrode portion is disposed inside the package body and corresponding to the first inner electrode portion, wherein the electronic chip is electrically connected between the first inner electrode portion and the second inner electrode portion. The first outer electrode portion is electrically contacting the first inner electrode portion, wherein the first lateral end portion of the package body is covered by the first outer electrode portion. The second outer electrode portion is corresponding to the first outer electrode portion and electrically contacting the second inner electrode portion, wherein the second lateral end portion of the package body is covered by the second outer electrode portion. The conductive unit includes a first conductive body disposed on the substrate body and electrically contacting the first outer electrode portion and a second conductive body disposed on the substrate body and electrically contacting the second outer electrode portion. More precisely, the package body has a first notch and a second notch corresponding to the first notch, the first inner electrode portion has a first top connection surface formed on a top side thereof and connected to the first notch, the second inner electrode portion has a second top connection surface formed on a top side thereof and connected to the second notch, the first outer electrode portion is extended into the first notch to contact the first top connection surface of the first inner electrode portion, and the second outer electrode portion is extended into the second notch to contact the second top connection surface of the second inner electrode portion.

More precisely, the electronic package component further comprising: a first electrical connection interface formed between the first top connection surface of the first inner electrode portion and the first outer electrode portion, a second electrical connection interface formed between the first lateral connection surface of the first inner electrode portion and the first outer electrode portion, a third electrical connection interface formed between the second top connection surface of the second inner electrode portion and the second outer electrode portion, and a fourth electrical connection interface formed between the second lateral connection surface of the second inner electrode portion and the second outer electrode portion.

Therefore, the electronic package component has a first notch formed on the package body and a second notch formed on the package body and corresponding to the first notch, and the first outer electrode portion is extended into the first notch to contact the first top connection surface of the first inner electrode portion and the second outer electrode portion is extended into the second notch to contact the second top connection surface of the second inner electrode portion, thus the bonding strength between the first inner electrode portion and the first outer electrode portion can be increased to prevent the first outer electrode portion from being broken away from the first inner electrode portion, and the bonding strength between the second inner electrode portion and the fourth outer electrode portion can be increased to prevent the second outer electrode portion from being broken away from the second inner electrode portion.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

First Embodiment

Figure 1:
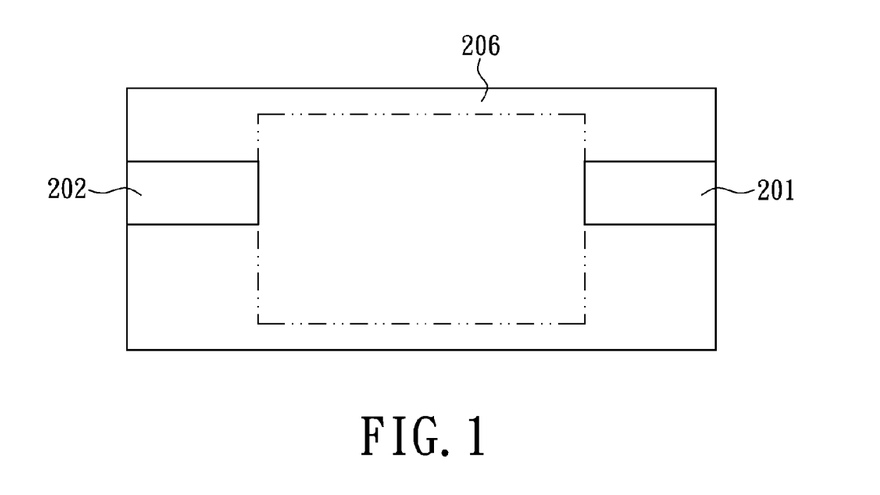
FIG. 1 shows a lateral, schematic view of the electronic package component without forming the first notch and the second notch according to the first embodiment of the instant disclosure.
Figure 2:
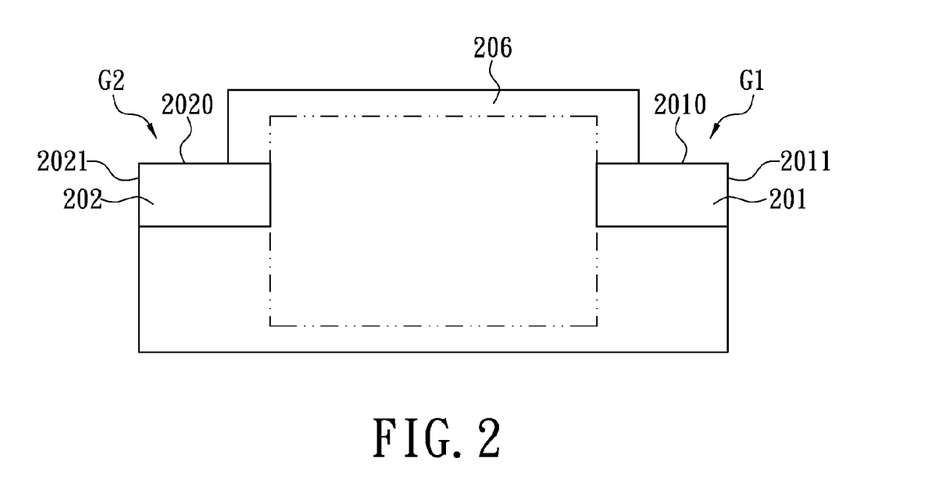
FIG. 2 shows a lateral, schematic view of the electronic package component having the first notch and the second notch according to the first embodiment of the instant disclosure.
Figure 3:
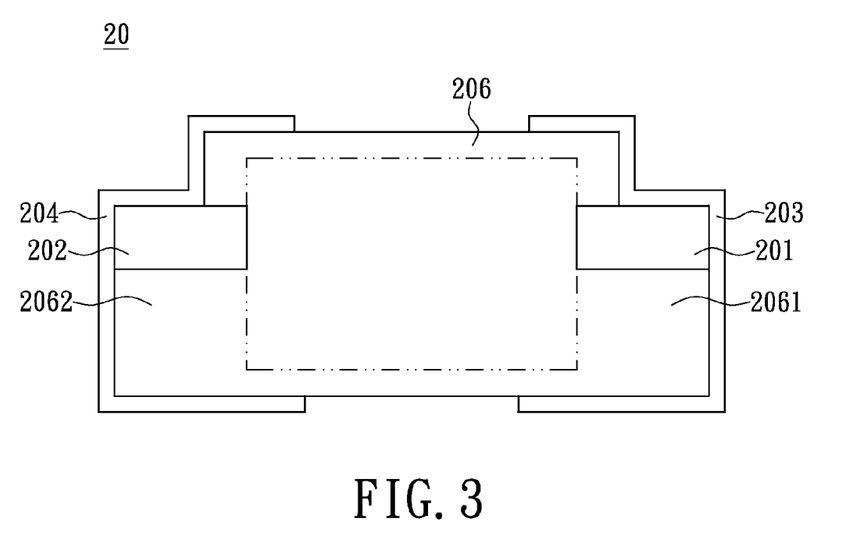
FIG. 3 shows a lateral, schematic view of the electronic package component having the first outer electrode portion and the second outer electrode portion according to the first embodiment of the instant disclosure.
Figure 4:
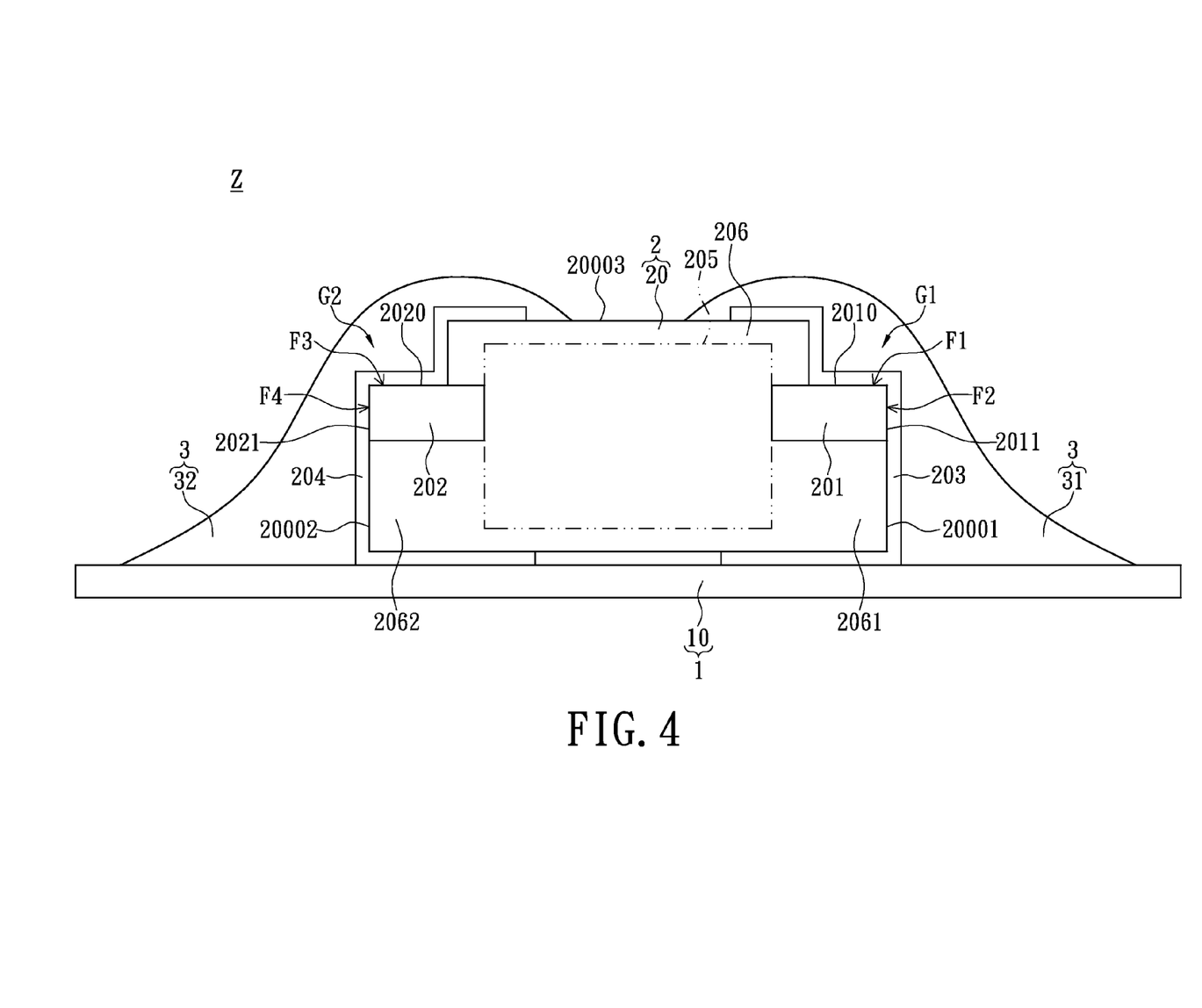
FIG. 4 shows a lateral, schematic view of the electronic structure according to the first embodiment of the instant disclosure.

Referring to FIG. 1 to FIG. 4, where the first embodiment of the instant disclosure a method of manufacturing an electronic structure Z for increasing the bonding strength between inside and outside electrodes, comprising the following steps of: first, referring to FIG. 1 and FIG. 2, forming a first notch G1 and a second notch G2 on a package body 206 for respectively exposing a first inner electrode portion 201 and a second inner electrode portion 202, wherein the package body 206 may be formed by opaque epoxy or silicone; next, referring to FIG. 2 and FIG. 3, respectively forming a first outer electrode portion 203 and a second outer electrode portion 204 on a first lateral end portion 2061 and a second lateral end portion 2062 of the package body 206, wherein the first outer electrode portion 203 and the second outer electrode portion 204 respectively contact the first inner electrode portion 201 and the second inner electrode portion 202 to form an electronic package component 20 (as shown in FIG. 3); finally, referring to FIG. 3 and FIG. 4, placing the electronic package component 20 on a substrate body 10, wherein a first conductive body 31 is soldered between the first outer electrode portion 203 and the substrate body 10 and a second conductive body 32 is soldered between the second outer electrode portion 204 and the substrate body 10 by reflow soldering for electrically connecting the electronic package component 20 to the substrate body 10, thus the manufacture of the electronic structure Z is finished (as shown in FIG. 4).

Referring to FIG. 4, the first embodiment of the instant disclosure an electronic structure Z for increasing the bonding strength between inside and outside electrodes by the above-mentioned method, comprising: a substrate unit 1, an electronic unit 2 and a conductive unit 3.

First, the substrate unit 1 includes a substrate body 10, and the substrate body 10 may be a circuit substrate having a plurality of conductive tracks (not shown) formed thereon. The electronic unit 2 includes at least one electronic package component 20 (may be an active component or a passive component, such as a common mode filter having an anti-EMI function) disposed on the substrate body 10. In addition, the electronic package component 20 includes a first inner electrode portion 201, a second inner electrode portion 202 corresponding to the first inner electrode portion 201, a first outer electrode portion 203 electrically contacting the first inner electrode portion 201, and a second outer electrode portion 204 corresponding to the first outer electrode portion 203 and electrically contacting the second inner electrode portion 202, and the electronic package component 20 has two opposite lateral end portions (i.e., the first lateral end portion 2061 and the second lateral end portion 2062) respectively covered by the first outer electrode portion 203 and the second outer electrode portion 204. The electronic package component 20 includes at least one electronic chip 205 formed by a semiconductor fabrication and electrically connected between the first inner electrode portion 201 and the second inner electrode portion 202 and a package body 206 for enclosing the electronic chip 205. Moreover, the conductive unit 3 includes a first conductive body 31 (such as a solder) disposed on the substrate body 10 and electrically contacting the first outer electrode portion 203 and a second conductive body 32 (such as a solder) disposed on the substrate body 10 and electrically contacting the second outer electrode portion 204.

In other words, the electronic package component 20 includes a package body 206, at least one electronic chip 205, a first inner electrode portion 201, a second inner electrode portion 202, a first outer electrode portion 203 and a second outer electrode portion 204. The package body 206 has a first lateral end portion 2061 and a second lateral end portion 2062 opposite to the first lateral end portion 2061. The electronic chip 205 is disposed inside the package body 206 and enclosed by the package body 206. The first inner electrode portion 201 is disposed inside the package body 206 and enclosed by the package body 206. The second inner electrode portion 202 is disposed inside the package body 206 and corresponding to the first inner electrode portion 201, wherein the electronic chip 205 is electrically connected between the first inner electrode portion 201 and the second inner electrode portion 202. The first outer electrode portion 203 is electrically contacting the first inner electrode portion 201, wherein the first lateral end portion 2061 of the package body 206 is covered by the first outer electrode portion 203. The second outer electrode portion 204 is corresponding to the first outer electrode portion 203 and electrically contacting the second inner electrode portion 202, wherein the second lateral end portion 2062 of the package body 206 is covered by the second outer electrode portion 204.

More precisely, referring to FIGS. 2 and 4, the electronic package component 20 has a first lateral surface 20001 (i.e., a lateral surface of the package body 206), a second lateral surface 20002 (i.e., another lateral surface of the package body 206) opposite to the first lateral surface 20001, and a top surface 20003 (i.e., a top surface of the package body 206) connected between the first lateral surface 20001 and the second lateral surface 20002. In addition, the electronic package component 20 has a first notch G1 formed on the package body 206 and a second notch G2 formed on the package body 206 and corresponding to the first notch G1. The first notch G1 is concaved from the top surface 20003 and connected to the first lateral surface 20001, and the second notch G2 is concaved from the top surface 20003 and connected to the second lateral surface 20002.

Furthermore, the first inner electrode portion 201 has a first top connection surface 2010 formed on a top side thereof and connected to the first notch G1, and the first inner electrode portion 201 has a first lateral connection surface 2011 formed on a lateral side thereof and exposed from the first lateral surface 20001 to contact the first outer electrode portion 203. The second inner electrode portion 202 has a second top connection surface 2020 formed on a top side thereof and connected to the second notch G2, and the second inner electrode portion 202 has a second lateral connection surface 2021 formed on a lateral side thereof and exposed from the second lateral surface 20002 to contact the second outer electrode portion 204. In addition, the first outer electrode portion 203 can be extended from the top surface to the bottom surface of the package body 206 to cover the first lateral end portion 2061 of the package body 206, and the first outer electrode portion 203 can be extended into the first notch G1 to contact the first top connection surface 2010 of the first inner electrode portion 201. The second outer electrode portion 204 can be extended from the top surface to the bottom surface of the package body 206 to cover the second lateral end portion 2062 of the package body 206, and the second outer electrode portion 204 can be extended into the second notch G2 to contact the second top connection surface 2020 of the second inner electrode portion 202.

More precisely, the electronic package component 20 has a first electrical connection interface F1 formed between the first top connection surface 2010 of the first inner electrode portion 201 and the first outer electrode portion 203, a second electrical connection interface F2 formed between the first lateral connection surface 2011 of the first inner electrode portion 201 and the first outer electrode portion 203, a third electrical connection interface F3 formed between the second top connection surface 2020 of the second inner electrode portion 202 and the second outer electrode portion 204, a fourth electrical connection interface F4 formed between the second lateral connection surface 2021 of the second inner electrode portion 202 and the second outer electrode portion 204.

In conclusion, the first notch G1 for exposing the first inner electrode portion 201 and the second notch G2 for exposing the second inner electrode portion 202 can be formed on the package body 206 in advance, thus when the first outer electrode portion 203 and the second outer electrode portion 204 are respectively extended into the first notch G1 and the second notch G2 to respectively contact the first inner electrode portion 201 and the second inner electrode portion 202, the first outer electrode portion 203 and the second outer electrode portion 204 can be formed as two stepped electrode portions or two stage difference structures. Therefore, there are two electrical connection interfaces (i.e., the first electrical connection interface F1 and the second electrical connection interface F2) can be naturally formed between the first inner electrode portion 201 and the first outer electrode portion 203, in order to increase the bonding strength between the first inner electrode portion 201 and the first outer electrode portion 203. There are two electrical connection interfaces (i.e., the third electrical connection interface F3 and the fourth electrical connection interface F4) can be naturally formed between the second inner electrode portion 202 and the fourth outer electrode portion 204, in order to increase the bonding strength between the second inner electrode portion 202 and the fourth outer electrode portion 204.

In other words, when the first conductive body 31 and the second conductive body 32 are respectively contacting the first outer electrode portion 203 and the second outer electrode portion 204 by reflow soldering, the residual stress generated by the reflow soldering process can be shared between the first top connection surface 2010 of the first inner electrode portion 201 and the second top connection surface 2020 of the second inner electrode portion 202 (i.e., the residual stress generated by the reflow soldering process can be shared between the first electrical connection interface F1 formed between the first top connection surface 2010 of the first inner electrode portion 201 and the first outer electrode portion 203 and the third electrical connection interface F3 formed between the second top connection surface 2020 of the second inner electrode portion 202 and the second outer electrode portion 204), thus the first outer electrode portion 203 can be tightly attached to the first top connection surface 2010 and the first lateral connection surface 2011 of the first inner electrode portion 201 (i.e., the first outer electrode portion 203 cannot be broken away or separated from the first inner electrode portion 201), and the second outer electrode portion 204 can be tightly attached to the second top connection surface 2020 and the second lateral connection surface 2021 of the second inner electrode portion 202 (i.e., the second outer electrode portion 204 cannot be broken away or separated from the second inner electrode portion 202).

Second Embodiment

Figure 5:
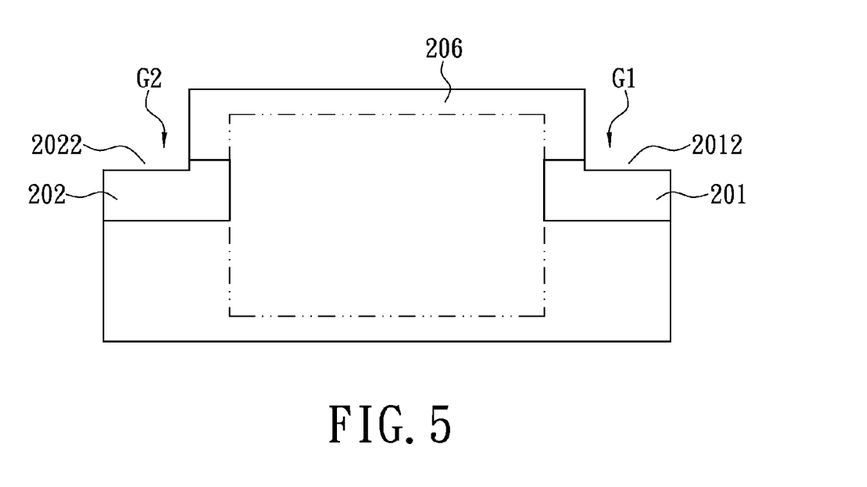
FIG. 5 shows a lateral, schematic view of the electronic package component having the first notch and the second notch according to the second embodiment of the instant disclosure.
Figure 6:
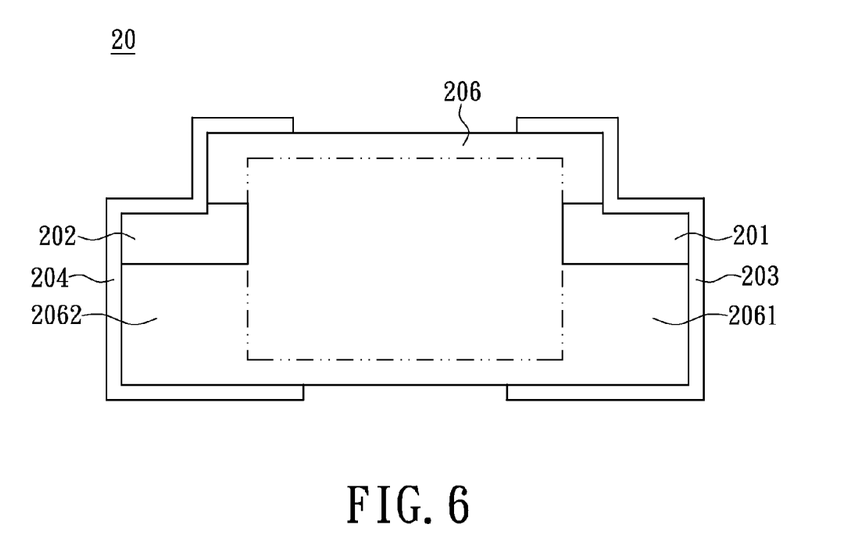
FIG. 6 shows a lateral, schematic view of the electronic package component having the first outer electrode portion and the second outer electrode portion according to the second embodiment of the instant disclosure.
Figure 7:
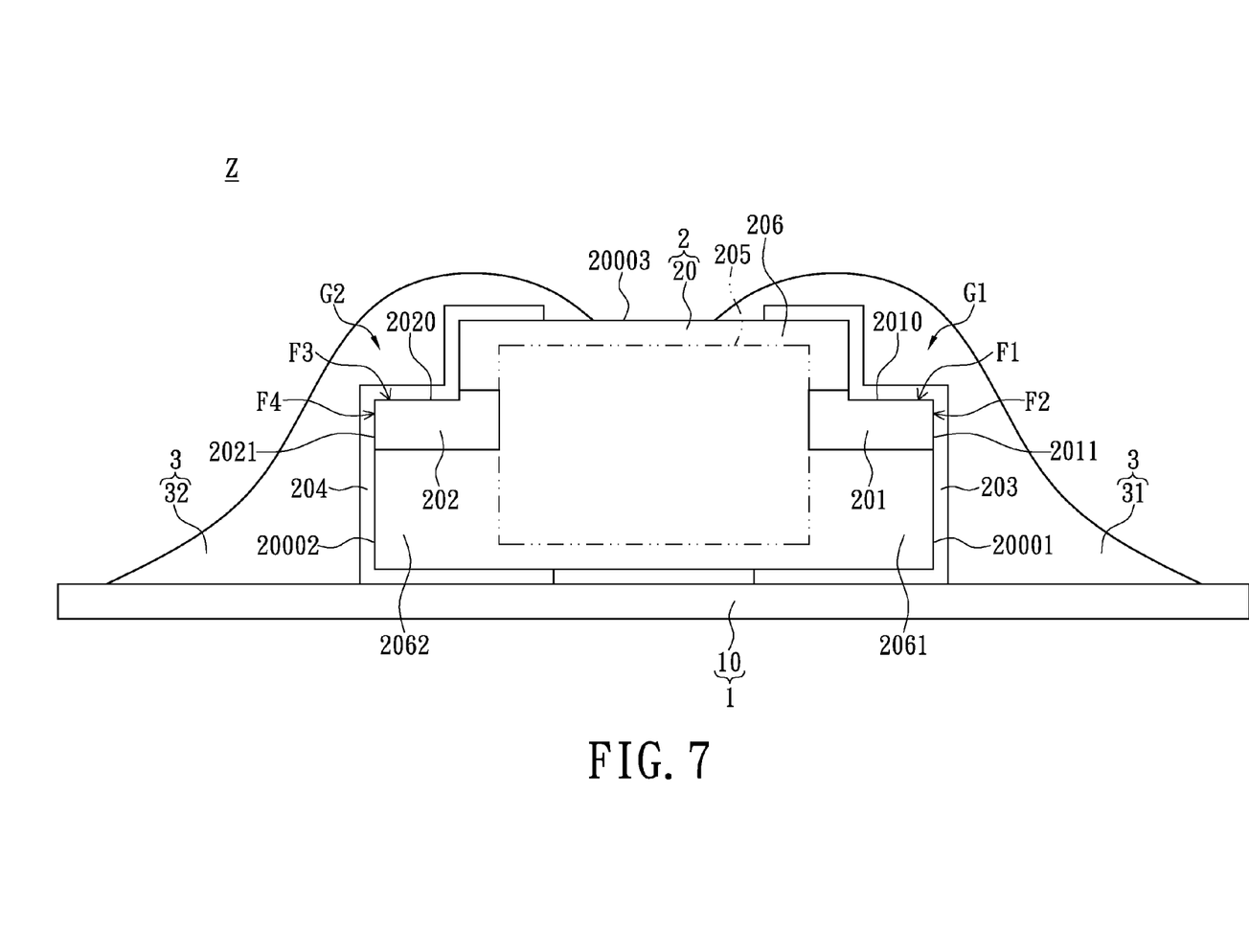
FIG. 7 shows a lateral, schematic view of the electronic structure according to the second embodiment of the instant disclosure.

Referring to FIG. 1, FIG. 5 and FIG. 7, where the second embodiment of the instant disclosure a method of manufacturing an electronic structure Z for increasing the bonding strength between inside and outside electrodes, comprising the following steps of: first, referring to FIG. 1 and FIG. 5, forming a first notch G1 and a second notch G2 on a package body 206 for respectively exposing a first inner electrode portion 201 and a second inner electrode portion 202, and respectively forming a first gap 2012 and a second gap 2022 concaved from a top side of the first inner electrode portion 201 and a top side of the second inner electrode portion 202 to respectively connected to the first notch G1 and the second notch G2, wherein the package body 206 may be formed by opaque epoxy or silicone; next, referring to FIG. 5 and FIG. 6, respectively forming a first outer electrode portion 203 and a second outer electrode portion 204 on a first lateral end portion 2061 and a second lateral end portion 2062 of the package body 206, wherein the first outer electrode portion 203 and the second outer electrode portion 204 respectively contact the first inner electrode portion 201 and the second inner electrode portion 202 to form an electronic package component 20 (as shown in FIG. 6); finally, referring to FIG. 6 and FIG. 7, placing the electronic package component 20 on a substrate body 10, wherein a first conductive body 31 is soldered between the first outer electrode portion 203 and the substrate body 10 and a second conductive body 32 is soldered between the second outer electrode portion 204 and the substrate body 10 by reflow soldering for electrically connecting the electronic package component 20 to the substrate body 10, thus the manufacture of the electronic structure Z is finished (as shown in FIG. 7).

Furthermore, comparing FIG. 7 with FIG. 4, and comparing FIG. 5 with FIG. 2, the difference between the second embodiment and the first embodiment is as follows: in the second embodiment, the first inner electrode portion 201 has a first gap 2012 concaved from a top side thereof and connected to the first notch G1, and the second inner electrode portion 202 has a second gap 2022 concaved from a top side thereof and connected to the second notch G2. In addition, the first outer electrode portion 203 can be extended into the first notch G1 and the first gap 2012 to contact the first top connection surface 2010 of the first inner electrode portion 201, and the second outer electrode portion 204 can be extended into the second notch G2 and the second gap 2022 to contact the second top connection surface 2020 of the second inner electrode portion 202.

In conclusion, the electronic package component 20 has a first notch G1 formed on the package body 206 and a second notch G2 formed on the package body 206 and corresponding to the first notch G1, and the first outer electrode portion 203 is extended into the first notch G1 to contact the first top connection surface 2010 of the first inner electrode portion 201 and the second outer electrode portion 204 is extended into the second notch G2 to contact the second top connection surface 2020 of the second inner electrode portion 202, thus the bonding strength between the first inner electrode portion 201 and the first outer electrode portion 203 can be increased to prevent the first outer electrode portion 203 from being broken away from the first inner electrode portion 201, and the bonding strength between the second inner electrode portion 202 and the fourth outer electrode portion 204 can be increased to prevent the second outer electrode portion 204 from being broken away from the second inner electrode portion 202.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. An electronic structure for increasing the bonding strength between inside and outside electrodes, comprising:
    a substrate unit including a substrate body;
    an electronic unit including at least one electronic package component disposed on the substrate body, wherein the at least one electronic package component includes a first inner electrode portion, a second inner electrode portion corresponding to the first inner electrode portion, a first outer electrode portion electrically contacting the first inner electrode portion, and a second outer electrode portion corresponding to the first outer electrode portion and electrically contacting the second inner electrode portion, and the at least one electronic package component has two opposite lateral end portions respectively covered by the first outer electrode portion and the second outer electrode portion; and
    a conductive unit including a first conductive body disposed on the substrate body and electrically contacting the first outer electrode portion and a second conductive body disposed on the substrate body and electrically contacting the second outer electrode portion;
    wherein, the at least one electronic package component has a first notch and a second notch corresponding to the first notch, the first inner electrode portion has a first top connection surface formed on a top side thereof and connected to the first notch, the second inner electrode portion has a second top connection surface formed on a top side thereof and connected to the second notch, the first outer electrode portion is extended into the first notch to contact the first top connection surface of the first inner electrode portion, and the second outer electrode portion is extended into the second notch to contact the second top connection surface of the second inner electrode portion.

2. The electronic structure of claim 1, wherein the at least one electronic package component has a first lateral surface, a second lateral surface opposite to the first lateral surface, and a top surface connected between the first lateral surface and the second lateral surface, the first notch is concaved from the top surface and connected to the first lateral surface, and the second notch is concaved from the top surface and connected to the second lateral surface.

3. The electronic structure of claim 2, wherein the first inner electrode portion has a first lateral connection surface formed on a lateral side thereof and exposed from the first lateral surface to contact the first outer electrode portion, and the second inner electrode portion has a second lateral connection surface formed on a lateral side thereof and exposed from the second lateral surface to contact the second outer electrode portion.

4. The electronic structure of claim 3, wherein the at least one electronic package component has a first electrical connection interface formed between the first top connection surface of the first inner electrode portion and the first outer electrode portion, a second electrical connection interface formed between the first lateral connection surface of the first inner electrode portion and the first outer electrode portion, a third electrical connection interface formed between the second top connection surface of the second inner electrode portion and the second outer electrode portion, a fourth electrical connection interface formed between the second lateral connection surface of the second inner electrode portion and the second outer electrode portion.

5. The electronic structure of claim 1, wherein the at least one electronic package component includes at least one electronic chip electrically connected between the first inner electrode portion and the second inner electrode portion and a package body for enclosing the at least one electronic chip, and both the first notch and the second notch are formed on the package body.

6. An electronic structure for increasing the bonding strength between inside and outside electrodes, comprising:
a substrate unit including a substrate body;
an electronic unit including at least one electronic package component disposed on the substrate body, wherein the at least one electronic package component includes a first inner electrode portion, a second inner electrode portion corresponding to the first inner electrode portion, a first outer electrode portion electrically contacting the first inner electrode portion, and a second outer electrode portion corresponding to the first outer electrode portion and electrically contacting the second inner electrode portion, and the at least one electronic package component has two opposite lateral end portions respectively covered by the first outer electrode portion and the second outer electrode portion; and
a conductive unit including a first conductive body disposed on the substrate body and electrically contacting the first outer electrode portion and a second conductive body disposed on the substrate body and electrically contacting the second outer electrode portion;
wherein, the at least one electronic package component has a first notch and a second notch corresponding to the first notch, the first inner electrode portion has a first gap concaved from a top side thereof and connected to the first notch, the second inner electrode portion has a second gap concaved from a top side thereof and connected to the second notch, the first outer electrode portion is extended into the first notch and the first gap to contact the first top connection surface of the first inner electrode portion, and the second outer electrode portion is extended into the second notch and the second gap to contact the second top connection surface of the second inner electrode portion.

7. An electronic package component for increasing the bonding strength between inside and outside electrodes, comprising:
a package body having a first lateral end portion and a second lateral end portion opposite to the first lateral end portion;
at least one electronic chip disposed inside the package body;
a first inner electrode portion disposed inside the package body;
a second inner electrode portion disposed inside the package body and corresponding to the first inner electrode portion, wherein the at least one electronic chip is electrically connected between the first inner electrode portion and the second inner electrode portion;
a first outer electrode portion electrically contacting the first inner electrode portion, wherein the first lateral end portion of the package body is covered by the first outer electrode portion;
a second outer electrode portion corresponding to the first outer electrode portion and electrically contacting the second inner electrode portion, wherein the second lateral end portion of the package body is covered by the second outer electrode portion; and
a conductive unit including a first conductive body disposed on the substrate body and electrically contacting the first outer electrode portion and a second conductive body disposed on the substrate body and electrically contacting the second outer electrode portion;
wherein, the package body has a first notch and a second notch corresponding to the first notch, the first inner electrode portion has a first top connection surface formed on a top side thereof and connected to the first notch, the second inner electrode portion has a second top connection surface formed on a top side thereof and connected to the second notch, the first outer electrode portion is extended into the first notch to contact the first top connection surface of the first inner electrode portion, and the second outer electrode portion is extended into the second notch to contact the second top connection surface of the second inner electrode portion.

8. The electronic package component of claim 7, wherein the package body has a first lateral surface, a second lateral surface opposite to the first lateral surface, and a top surface connected between the first lateral surface and the second lateral surface, the first notch is concaved from the top surface and connected to the first lateral surface, and the second notch is concaved from the top surface and connected to the second lateral surface.

9. The electronic package component of claim 8, wherein the first inner electrode portion has a first lateral connection surface formed on a lateral side thereof and exposed from the first lateral surface to contact the first outer electrode portion, and the second inner electrode portion has a second lateral connection surface formed on a lateral side thereof and exposed from the second lateral surface to contact the second outer electrode portion.

10. The electronic package component of claim 9, further comprising:
a first electrical connection interface formed between the first top connection surface of the first inner electrode portion and the first outer electrode portion;
a second electrical connection interface formed between the first lateral connection surface of the first inner electrode portion and the first outer electrode portion;
a third electrical connection interface formed between the second top connection surface of the second inner electrode portion and the second outer electrode portion; and
a fourth electrical connection interface formed between the second lateral connection surface of the second inner electrode portion and the second outer electrode portion.

* * * * *